United States Patent [19]
Corbridge

[11] Patent Number: 5,998,971
[45] Date of Patent: Dec. 7, 1999

[54] APPARATUS AND METHOD FOR COULOMETRIC METERING OF BATTERY STATE OF CHARGE

[75] Inventor: Mark Corbridge, Buckinghamshire, United Kingdom

[73] Assignee: NEC Corporation, Tokyo, Japan

[21] Appl. No.: 09/209,173

[22] Filed: Dec. 10, 1998

[30] Foreign Application Priority Data

Dec. 10, 1997 [GB] United Kingdom .................... 9726104

[51] Int. Cl.[6] .......................... H01M 10/46; H01M 10/44
[52] U.S. Cl. .................................. 320/132; 320/DIG. 21; 324/428
[58] Field of Search ........................... 320/132, DIG. 18, 320/DIG. 21; 324/426, 428, 427, 433, 432

[56] References Cited

U.S. PATENT DOCUMENTS 4,499,424  2/1985  Rowlette ................................. 324/427

Primary Examiner—Edward H. Tso
Attorney, Agent, or Firm—Scully, Scott, Murphy & Presser

[57] ABSTRACT

The apparatus for metering the state of charge of a battery has a battery current sensor providing a voltage signal dependent on a current flowing into or out of the battery, an integrator for integrating the voltage signal, a window detector circuit providing an output signal each time an output of the integrator reaches an upper or lower threshold voltage level, a digital processing device utilizing the output signals of the window detector circuit to construct a digital battery charge state model, and a switch arrangement for reversing connection of the battery current sensor to the integrator periodically so as to cancel effect of any voltage offset in the output of the integrator.

7 Claims, 2 Drawing Sheets

APPARATUS AND METHOD FOR COULOMETRIC METERING OF BATTERY STATE OF CHARGE

BACKGROUND OF THE INVENTION

1. Field of the Invention

This invention relates to apparatus and method for the coulometric metering of the state of charge of a battery, for use, for instance, in a handheld telecommunications device.

2. Description of the Prior Art

Conventionally, battery state of charge meters depend on either measuring the voltage across the battery, or measuring the battery current and charging or discharging a battery modeling device. Judging battery state of charge purely on the basis of the battery voltage is difficult because of variations of battery voltage with load and temperature. Battery history is also relevant. Furthermore, a high level of accuracy of voltage measurement is required as the voltage fluctuates little.

In so-called coulometric metering using a battery modeling device, the modeling device is charged and discharged in accordance with the current flowing into and out of the battery. The modeling device has traditionally been an analog device, but a digital model is more appropriate for use in handheld telecommunications devices. Periodically sampling the battery current and converting the current samples to digital format for digital processing involves various problems. To keep the power consumed by the metering process as low as possible, the sampling frequency should kept be low, but this can give rise to inaccuracies caused by short current pulses between samples. The accuracy of conversion also needs to be high and, because very low current levels are involved, small errors introduced by the analog components of the sampling circuitry can become significant.

SUMMARY OF THE INVENTION

The present invention has for its object to provide a method and apparatus for accurately metering battery state of charge in which the problems mentioned above are overcome.

In accordance with one aspect of the invention there is provided an apparatus for metering the state of charge of a battery, comprising a battery current sensor providing a voltage signal dependent on the current flowing into or out of the battery, an integrator for integrating the voltage signal, window detector means providing an output signal each time the output of the integrator reaches an upper or lower threshold voltage level, digital processing means utilizing the output signals of the window detector means to construct a digital battery charge state model, and switch means for reversing the connection of the battery current sensor to the integrator periodically so as to cancel the effect of any voltage offset in the output of the integrator.

Preferably, the window detector means comprises an upper threshold level detector, a lower level threshold detector and means for resetting the output of the integrator to an intermediate voltage level each time the output of the integrator reaches the upper or lower threshold voltage level.

In accordance with another aspect of the invention, there is provided a method of metering the state of charge of a battery comprising the steps of deriving a voltage signal dependent on the current flowing into or out of the battery, integrating the voltage signal, detecting when the integrated voltage signal reaches an upper or a lower voltage level to provide associated detection signals, digitally processing the associated detection signals to generate a digital battery state of charge model, and periodically reversing the direction of the integration to cancel out the effect of offset voltages.

The above and other objects, features, and advantages of the present invention will become apparent from the following description based on the accompanying drawings which illustrate an example of a preferred embodiment of the present invention.

DESCRIPTION OF THE PREFERRED EMBODIMENT

Figure 1:
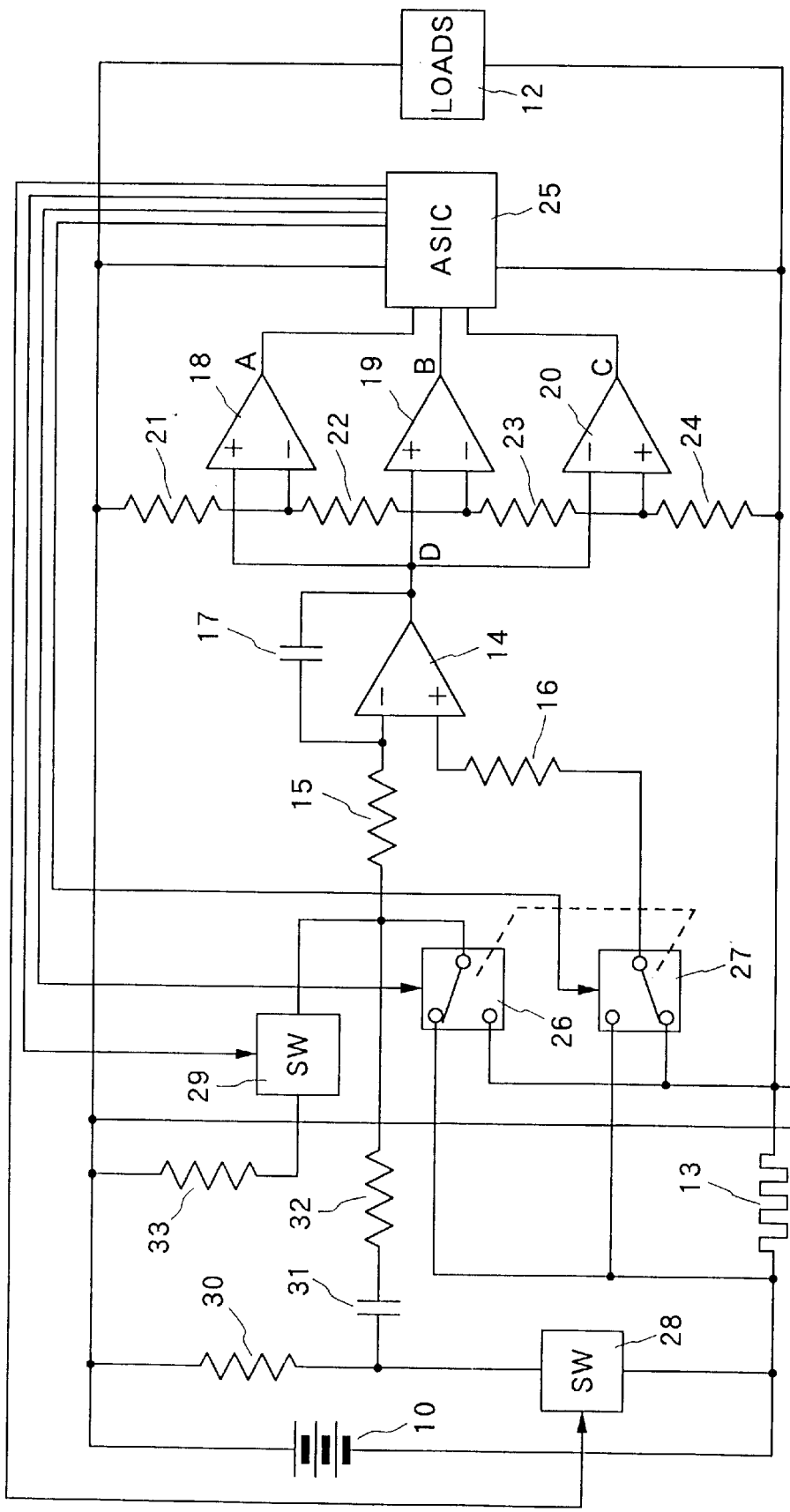
FIG. 1 is a circuit diagram of an apparatus for metering battery state of charge according to a preferred embodiment of the present invention.

As shown in FIG. 1, a battery 10, which is an object of metering state of charge, is connected to a charger input 11 and various loads 12 via a current sensor in the form of a high precision resistor 13 of very low ohmic value. The resistor 13 generates a voltage signal of polarity dependent on the direction of flow of current and magnitude directly proportional to the current flowing into or out of the battery.

An operational amplifier 14 is connected to operate as an integrator to produce an output voltage signal dependent on the time integral of the voltage across the resistor 13. To this end, the two input terminals of the operational amplifier 14 are connected via two resistors 15 and 16 and a reversing switch arrangement to opposite ends of the resistor 13, and a feedback capacitor 17 is connected between the output terminal of the operational amplifier 14 and the inverting input terminal thereof.

A window detector circuit comprising three voltage comparator circuits 18, 19 and 20 and a resistor chain is connected to the output terminal of the integrator operational amplifier 14 and provides three inputs to an ASIC (Application Specific Integrated Circuit) 25. The resistor chain has four resistors 21, 22, 23 and 24 connected in series. As shown the comparator 18 has its non-inverting input terminal connected to the output of the amplifier 14 and its inverting input connected to a point on the resistor chain, such that the output of the comparator 18 is low when the output of the amplifier 14 is below an upper threshold voltage level. Similarly the comparator 19 is connected so that its output is low when the output of the amplifier 14 is below an intermediate voltage level. The comparator 20, on the other hand, has its inverting input terminal connected to the output terminal of the amplifier 14, such that its output is low whenever the output of the amplifier 14 is above a lower threshold voltage level. The resistors 22 and 23 are preferably of the same ohmic value so that the intermediate voltage referred to above is mid-way between the upper and lower threshold voltage levels.

The ASIC 25 is provided to realize a digital battery charge state model by digital processing. The ASIC 25 is programmed to process signals received from the window detector and to control the reversing switch arrangement referred to above as well as an integrator resetting switch arrangement. The reversing switch arrangement comprises two electronic switch devices 26 and 27 connected to act as change-over switches, such that the inverting input of the amplifier 14 can be connected by the switch device 26 to either end of the resistor 13, whilst the non-inverting input is connected to the other end of the resistor 13 by the switch device 27. The resetting switch arrangement comprises two further electronic switch devices 28 and 29. Switch device 28 is connected at one side to the negative terminal of the battery 10 and at the other side via a resistor 30 to the positive terminal of the battery 10. A capacitor 31 and a resistor 32 in series connect this other side of the switch device 28 to the resistor 15. The switch device 29 is connected in series with a resistor 33 between the positive terminal of the battery 10 and the resistor 15. When the switch device 28 is closed, the capacitor 31 is connected directly to the negative terminal of the battery 10 and causes current to be drawn from the summing point of the integrator 14, thereby making the output of the amplifier 14 rise rapidly, switch 29 on the other hand forces current into the summing point of the integrator 14 causing its output to fall rapidly.

During discharging of the battery 10, the voltage at the right hand end of the resistor 13 is higher than that at the left hand end. Each operating cycle of the metering apparatus commences with the output of the integrator 14 set a value just slightly above the intermediate voltage level set by comparator 19. The switches 26 and 27 are set by the ASIC 25 to connect the inverting input of the integrator 14 to the lower voltage end of the resistor 13 and the inverting input to the higher voltage end. The output of the integrator 14 thus ramps up at a rate determined by the battery current. When the integrator output reaches the upper threshold voltage level set by the comparator 18, the ASIC 25 operates the switch device 29 which causes the integrator output voltage to fall rapidly, until it is just below the intermediate voltage level set by comparator 19 when the ASIC 25 terminates the drive signal to the switch device 29 and operates the switch devices 26 and 27 to reverse the connections between the integrator 14 and the resistor 13. The output of the integrator 14 now ramps downwardly until it reaches the lower threshold level set by the comparator 20, when the ASIC 25 operates the switch device 28 to cause the integrator output voltage to be reset to the intermediate value and restores the connections between the integrator 14 and the resistor 13 to their original settings.

Figure 2:
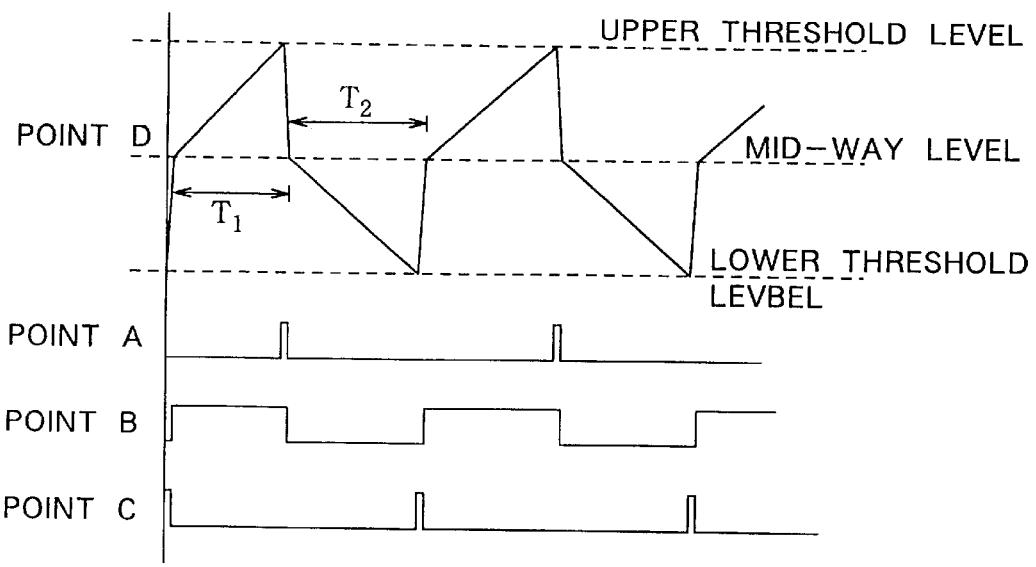
FIG. 2 is a set of timing charts illustrating the operation of the apparatus shown in FIG. 1.

FIG. 2 illustrates such operation cycle. The outputs of the comparators 18, 19 and 20 are referred as to points A, B and C, respectively, and the output of the amplifier 14 is referred as to point D.

The battery state of charge model maintained by the ASIC 25 is updated at the end of each such cycle. The durations of the two parts of the cycle are used by the ASIC 25 to determine the quantity of charge taken from the battery 10 during the cycle. The charge Q taken is determined by the formula:

$$Q = K^* ((1/T_1) + (1/T_2))/(T_1 + T_2)$$

where $T_1$ and $T_2$ are the durations of the first and second parts of the cycle and K is a constant. The amount calculated in each cycle is subtracted from a value held in a register which represents the existing state of charge. The register is provided within the ASIC 25.

When the battery 10 is charging, the output of the integrator 14 will go the opposite way for the same settings of the switch devices 26 and 27. The calculated value of the charge added to the battery 10 is added to the value held in the register.

It will be noted that as the battery current is continuously monitored, rather than sampled periodically, there is no chance of short duration transient current pulses being missed. Very low level currents can be sensed accurately and an accurate calculation of the charge used or added can be made to update the model. Any offset voltage at the input of the integrator 14 which might have introduced an error in the calculation, will be compensated for by the reversal of the direction of integration half way through each measuring cycle. An error which shortens the first part $T_1$ of the cycle will lengthen the second part $T_2$ thereof.

It should be noted that the present invention is of particular utility in handheld telecommunication devices which have a power saving "sleep" mode. In such devices much of the circuitry is powered down for timed intervals when the device is not actually involved in a call. The sleep mode may be prematurely terminated by various events, such as a key press and in the present case, by any threshold crossing event of the window detector circuit. During sleep mode the current drawn from the battery is very low, but there is a transient current peak when the sleep period is terminated. The current monitoring integrator and the window detector circuit described above would not be powered down during sleep mode, so that an accurate assessment of the charge used can still be made. Should a threshold crossing event occur during sleep mode, such mode will be prematurely terminated to enable the timing to be established and the charge usage calculation made.

While preferred embodiments of the present invention have been described using specific terms, such description is for illustrative purposes only, and it is to be understood that changes and variations may be made without departing from the spirit or scope of the following claims.

What is claimed is:

1. An apparatus for metering a state of charge of a battery, comprising:
    a battery current sensor providing a voltage signal dependent on a current flowing into or out of the battery;
    an integrator for integrating the voltage signal;
    window detector means providing an output signal each time an output of the integrator reaches an upper or lower threshold voltage level;
    digital processing means utilizing the output signals of the window detector means to construct a digital battery charge state model; and
    switch means for reversing connection of the battery current sensor to the integrator periodically so as to cancel effect of any voltage offset in the output of the integrator.

2. An apparatus as claimed in claim 1 wherein the window detector means comprises an upper threshold level detector, a lower level threshold detector and means for resetting the output of the integrator to an intermediate voltage level each time the output of the integrator reaches the upper or lower threshold voltage level.

3. An apparatus as claimed in claim 2 wherein the digital processing means also controls the switch means in accordance with signals received from the window detector means.

4. An apparatus as claimed in claim 2 wherein the intermediate voltage level is a mid-way voltage level between the upper and lower threshold voltage levels.

5. A method of metering a state of charge of a battery comprising the steps of:

deriving a voltage signal dependent on a current flowing into or out of the battery;

integrating the voltage signal;

detecting when the integrated voltage signal reaches an upper or a lower threshold voltage level to provide associated detection signals;

digitally processing the associated detection signals to generate a digital battery state of charge model; and periodically reversing a direction of the integration to cancel out effect of offset voltages.

6. A method as claimed in claim 5 further comprising a step of resetting the output of the integrator to an intermediate voltage level each time the output of the integrator reaches the upper or lower threshold voltage level.

7. A method as claimed in claim 6 wherein the intermediate voltage level is a mid-way voltage level between the upper and lower threshold voltage levels.

* * * * *